(12) United States Patent
Chang et al.

(10) Patent No.: US 8,546,891 B2
(45) Date of Patent: Oct. 1, 2013

(54) FIN PROFILE STRUCTURE AND METHOD OF MAKING SAME

(75) Inventors: Chia-Wei Chang, Taichung (TW);
Chih-Fang Liu, Taipei (TW);
Chih-Tang Peng, Taipei (TW);
Tai-Chun Huang, Hsin-Chu (TW);
Ryan Chia-Jen Chen, Chiaya (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/408,538

(22) Filed: Feb. 29, 2012

(65) Prior Publication Data

US 2013/0221448 A1 Aug. 29, 2013

(51) Int. Cl.
*H01L 29/78* (2006.01)

(52) U.S. Cl.
USPC .................................. 257/401; 257/E29.266

(58) Field of Classification Search
USPC ........... 257/401, 365, 324, E29.266, E29.104
See application file for complete search history.

(56) References Cited

U.S. PATENT DOCUMENTS

| 7,141,856 B2 | 11/2006 | Lee et al. |
| 7,301,210 B2 * | 11/2007 | Abadeer et al. ............... 257/401 |
| 7,888,751 B2 * | 2/2011 | Sawada ......................... 257/401 |
| 8,368,148 B2 * | 2/2013 | Inaba ............................ 257/369 |
| 2011/0068405 A1 | 3/2011 | Yuan et al. |

FOREIGN PATENT DOCUMENTS

| KR | 10-0496891 B1 | 6/2005 |
| KR | 10-2011-0033039 A | 3/2011 |

* cited by examiner

*Primary Examiner* — Roy Potter
(74) *Attorney, Agent, or Firm* — Slater & Matsil, L.L.P.

(57) ABSTRACT

A FinFET device may include a first semiconductor fin laterally adjacent a second semiconductor fin. The first semiconductor fin and the second semiconductor fin may have profiles to minimize defects and deformation. The first semiconductor fin comprises an upper portion and a lower portion. The lower portion of the first semiconductor fin may have a flared profile that is wider at the bottom than the upper portion of the first semiconductor fin. The second semiconductor fin comprises an upper portion and a lower portion. The lower portion of the second semiconductor fin may have a flared profile that is wider than the upper portion of the second semiconductor fin, but less than the lower portion of the first semiconductor fin.

14 Claims, 13 Drawing Sheets

FIN PROFILE STRUCTURE AND METHOD OF MAKING SAME

BACKGROUND

Transistors are key components of modern integrated circuits. To satisfy the requirements of increasingly faster speed, the drive currents of transistors need to be increasingly greater. Since the drive currents of transistors are proportional to gate widths of the transistors, transistors with greater widths are preferred.

The increase in gate widths, however, conflicts with the requirements of reducing the sizes of semiconductor devices. Fin field-effect transistors (FinFET) were thus developed.

The introduction of FinFETs has the advantageous feature of increasing drive current without the cost of occupying more chip area. However, the small size of FinFET transistors raises numerous issues during their production and manufacturing.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1B:
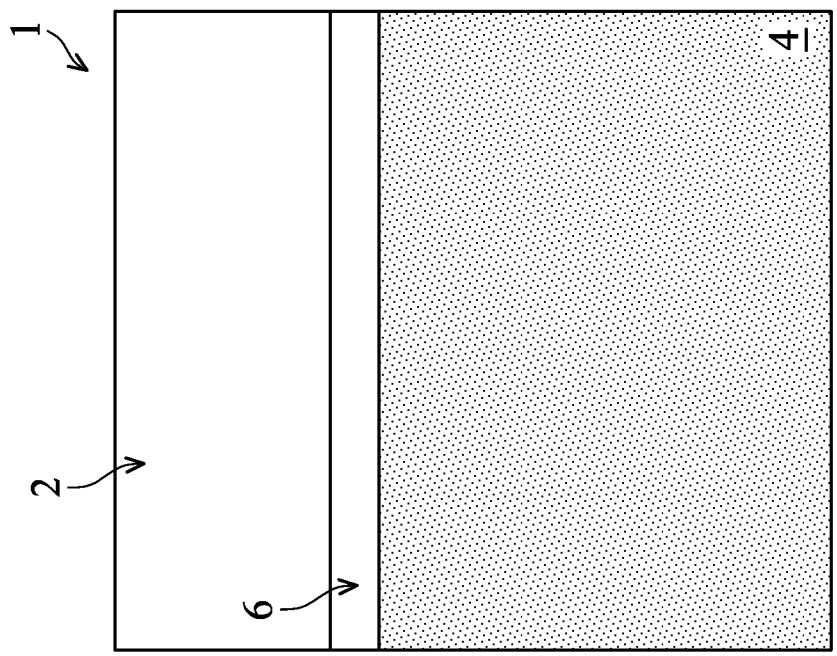
FIGS. 1a through 9b illustrate in perspective view and cross-sectional view, respectively, various stages in the manufacture of a FinFET device in accordance with an embodiment.

Various steps in the formation of a fin device will be described with reference to FIGS. 1a through 9b. Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1A:
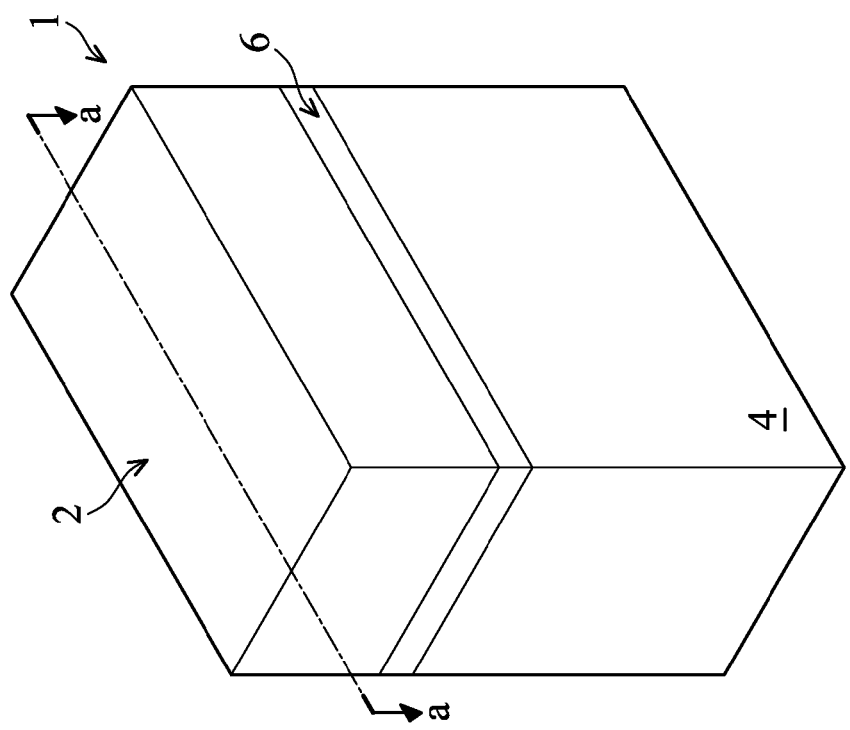

With reference now to FIG. 1a, there is shown a perspective view of the FinFET device 1 at an intermediate point of processing. FIG. 1b illustrates a cross-sectional view of the FinFET device along the a-a line of FIG. 1a. The FinFET device 1 includes a photo-sensitive material layer 2 on a hard mask layer 6 which is on a semiconductor substrate 4. The semiconductor substrate 4 may be silicon, SiGe, the like, or a combination thereof. The semiconductor substrate 4 may comprise bulk silicon, doped or undoped, or an active layer of a silicon-on-insulator (SOI) substrate. Other substrates that may be used include multi-layered substrates, gradient substrates, or hybrid orientation substrates.

The semiconductor substrate 4 may include active and passive devices (not shown in FIG. 1a or 1b for clarity). As one of ordinary skill in the art will recognize, a wide variety of active and passive devices such as transistors, capacitors, resistors, combinations of these, and the like may be used to generate the structural and functional requirements of the design for the FinFET device 1. The active and passive devices may be formed using any suitable methods.

The semiconductor substrate 4 may also include metallization layers (also not shown in FIG. 1a or 1b for clarity). The metallization layers may be formed over the active and passive devices and are designed to connect the various active devices to form functional circuitry. The metallization layers (not shown) may be formed of alternating layers of dielectric (e.g., low-k dielectric material) and conductive material (e.g., copper) and may be formed through any suitable process (such as deposition, damascene, dual damascene, etc.). The metallization and dielectric layers may include metal lines and vias (not shown) to electrically couple active and passive devices to the FinFET device 1. Only a portion of the semiconductor substrate 4 is illustrated in the figures, as this is sufficient to fully describe the illustrative embodiments.

The hard mask layer 6 is formed on top of the semiconductor substrate 4. The hard mask layer 6 is a protective layer to prevent the underlying structures, such as the top surface of the semiconductor substrate 4, from being removed during an etching process. In an embodiment, the hard mask layer 6 may comprise a single silicon nitride layer. In another embodiment, the hard mask layer 6 comprises an oxide layer, such as a silicon oxide layer, and an overlying nitride layer, such as a silicon nitride ($Si_3N_4$) layer. The oxide layer may be formed by any oxidation process, such as wet or dry thermal oxidation in an ambient comprising an oxide, $H_2O$, NO, or a combination thereof, or by CVD techniques. As one of ordinary skill in the art will appreciate that other mask materials and/or structures may be used to form hard mask layer 6. For example, other materials, a single layer, three or more layers, or the like may be used.

Photo-sensitive material layer 2 is formed on top of the hard mask layer 6. The photo-sensitive material layer 2 may comprise polybenzoxazole (PBO), SU-8 photo-sensitive epoxy, film type polymer materials and/or the like.

Figure 2B:
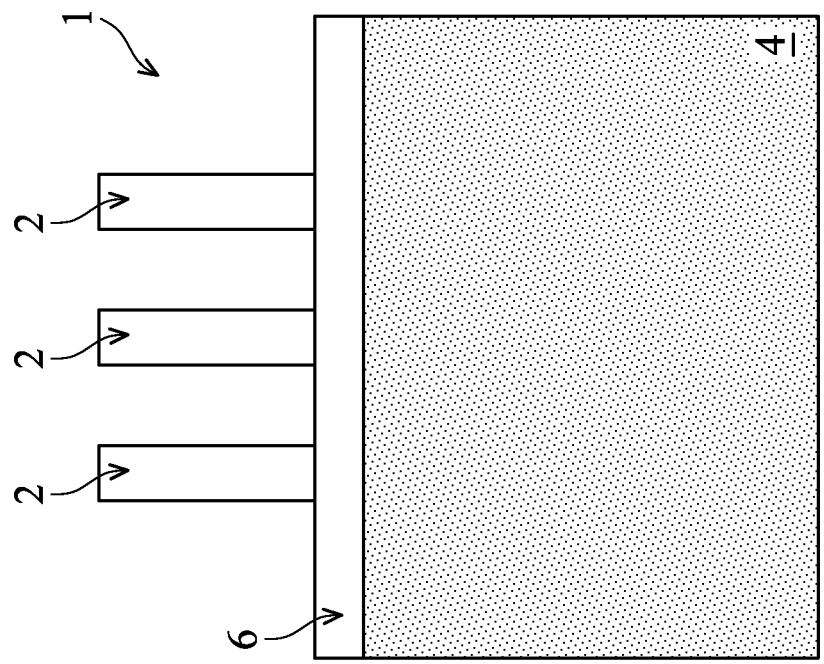
Figure 2A:
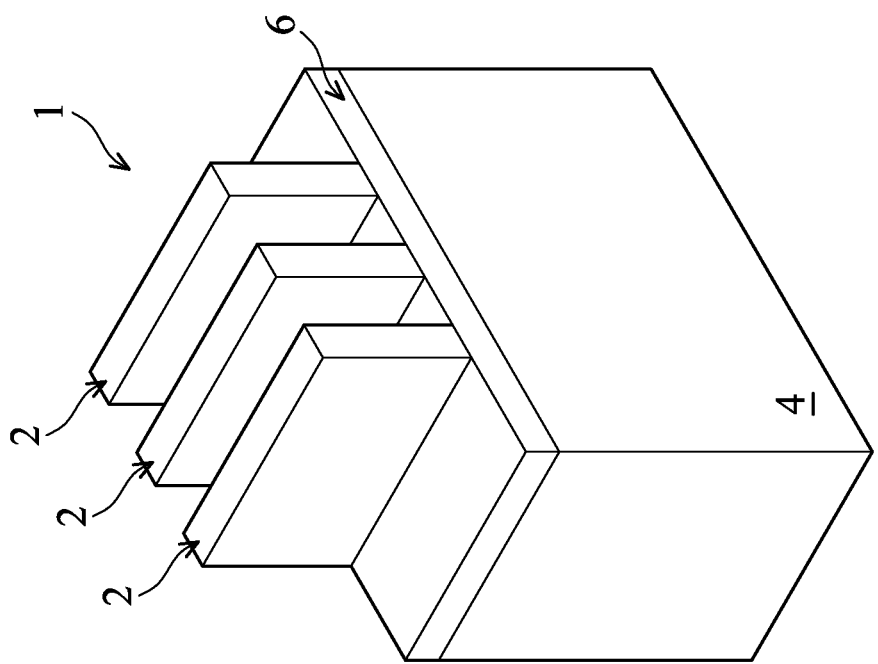

In FIGS. 2a and 2b, the photo-sensitive material layer 2 has been patterned forming a plurality of openings in the photo-sensitive material layer 2 on top of the hard mask layer 6. Selective areas of the photo-sensitive material layer 2 may be exposed to light. The physical properties of the photo-sensitive regions exposed to light change as a result. According to an embodiment, the change of the physical properties of the exposed regions will cause the exposed regions to be etched away when a developer solution is applied to the photo-sensitive material layer 2. As a result, the photo-sensitive material layer 2 is patterned as shown in FIGS. 2a and 2b.

Figure 3B:
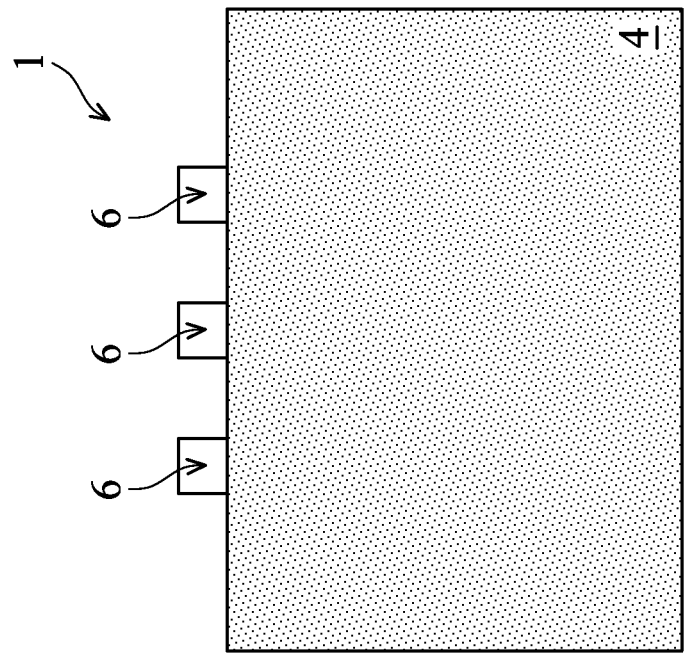
Figure 3A:
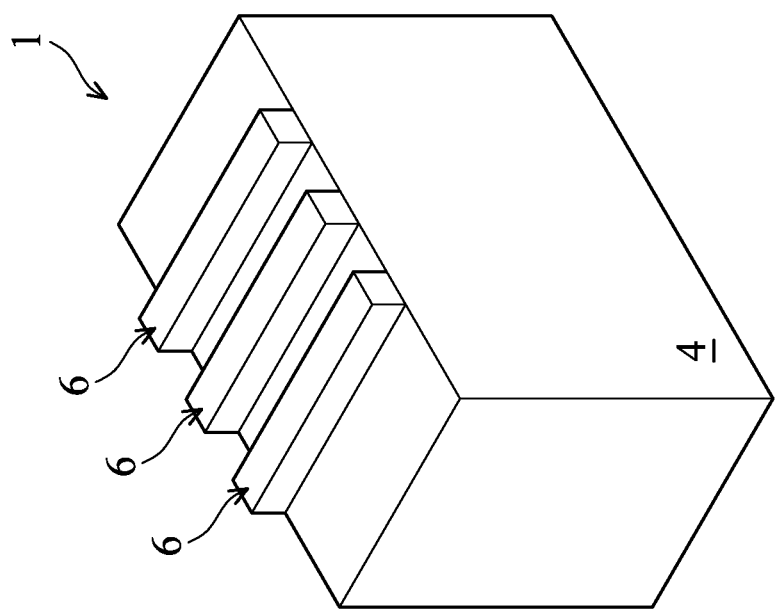

FIGS. 3a and 3b illustrate transferring the pattern of the photo-sensitive material layer 2 to the hard mask layer 6. The pattern may be transferred from the photo-sensitive material layer 2 to the hard mask layer 6 using an etch process, such as an anisotropic plasma etch process. One skilled in the art will recognize numerous processes that are sufficient for etching the hard mask layer 6; hence the details of the etch process are not discussed herein. During this pattern transfer process, patterned photo-sensitive material layer 2 may be entirely consumed as indicated by FIGS. 3a and 3b. In some embodiments, the patterned photo-sensitive material layer 2 is not entirely consumed, but rather remaining portions of patterned photo-sensitive material layer 2 may be removed using, e.g., an oxygen plasma or an ashing process. As one of ordinary skill in the art will appreciate, the step of transferring the pattern from the photo-sensitive material layer 2 to the hard mask layer 6 may be skipped and performed simultaneously with the next step of etching the upper portions 81 of the fins 8.

Figure 4B:
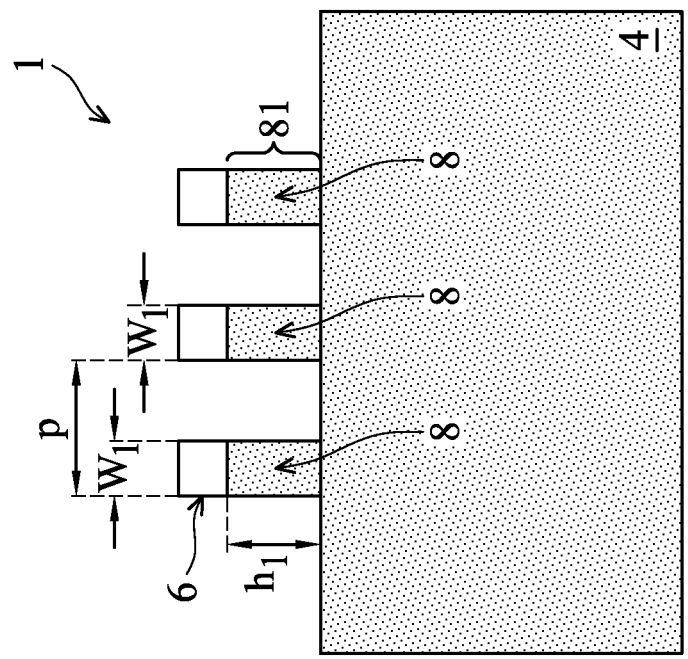
Figure 4A:
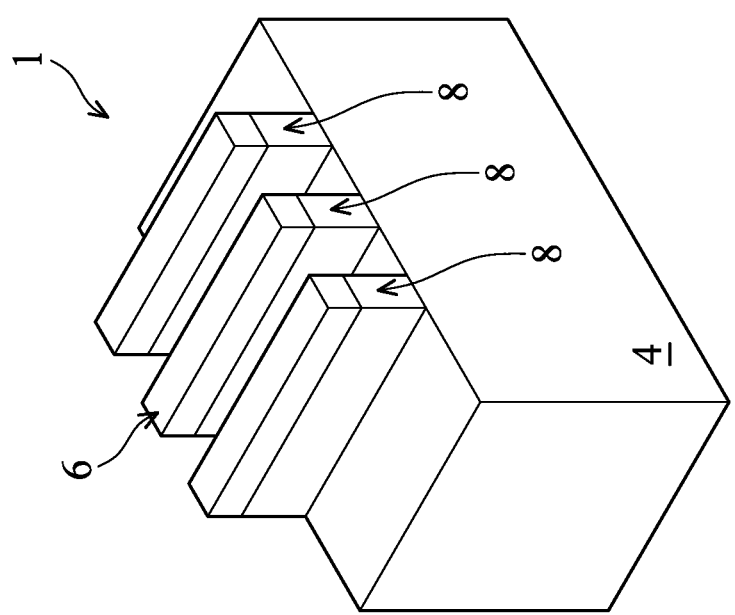

In FIGS. 4a and 4b, the exposed areas of semiconductor substrate 4 are etched to form the upper portions 81 of the fins 8. In an embodiment, an anisotropic plasma dry etch process is conducted in a plasma etch chamber. The etchant gas may contain $SF_6$, $CF_4$, $NF_3$, the like, or combinations of these. The etch process may be a time-controlled process, and continue until the upper portions 81 reach a predetermined height $h_1$ from about 5 nm to about 50 nm and a width $w_1$ from about 5 nm to 40 nm. Also, the fins 8 have a fin pitch p (see FIG. 4b) which comprises the width $w_1$ of a single fin 8 and the space between the single fin 8 and the adjacent fin 8. In an embodiment, the fin pitch p may be from about 30 nm to 70 nm. In additional and/or alternative embodiments, an anisotropic reactive ion etch (RIE) may be used to the upper portions 81, although other suitable dry etch processes are not excluded.

Figure 5B:
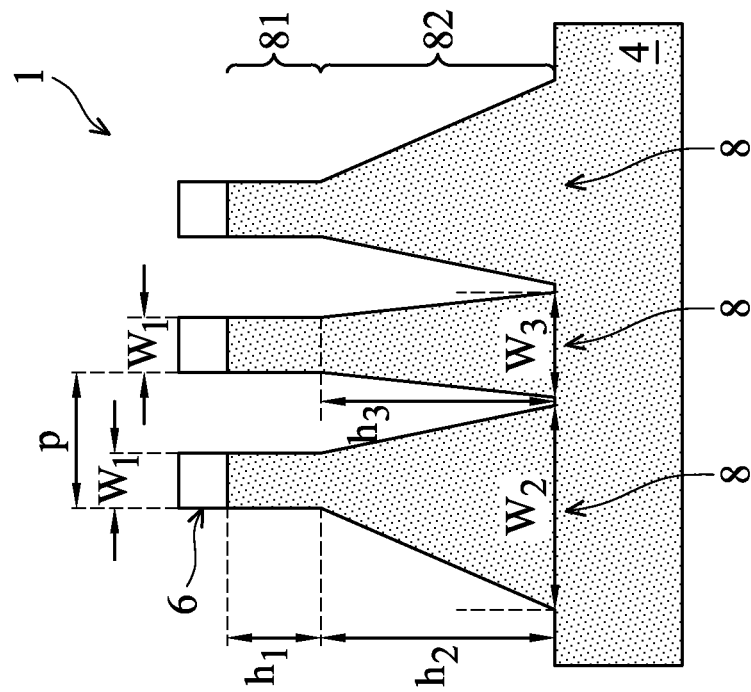
Figure 5A:
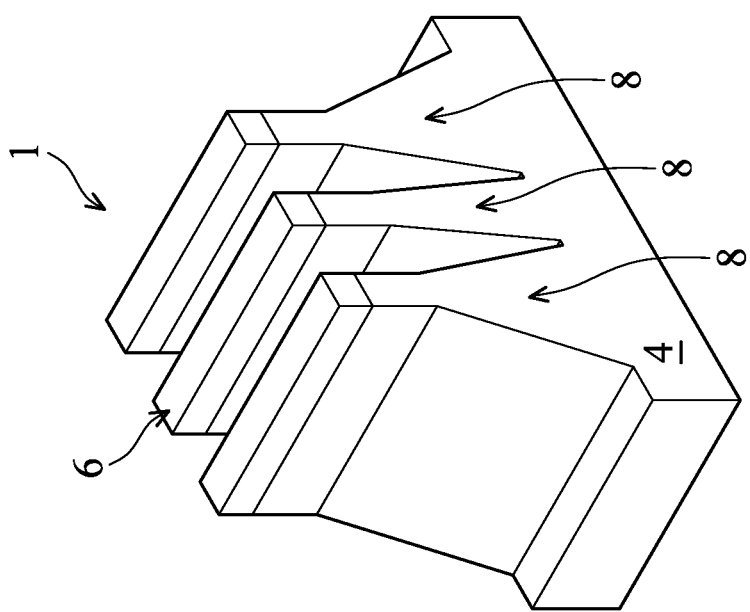

FIGS. 5a and 5b illustrate the formation of the lower portions 82 of the fins 8. A second etch process is applied to the exposed areas of the semiconductor substrate 4 to form the flared profile of the lower portions 82. In an embodiment, the etch process is an anisotropic plasma dry etch process conducted in the same plasma etch chamber as the etch process for the upper portions 81. The etchant gas may contain HBr, $Cl_2$, $O_2$, $N_2$, the like, or combinations of these. The resulting structure includes a plurality of fins 8 formed in the semiconductor substrate 4. Each fin of the plurality of fins 8 has a sidewall, the upper portion of the sidewall being substantially orthogonal to a top surface of the semiconductor substrate 4, and a lower portion of the sidewall being non-orthogonal to the top surface of the semiconductor substrate 4. In this specific embodiment, the lower portion 82 of the sidewall has a substantially constant slope as opposed to some of the other embodiments (discussed below). Furthermore, the outer sidewalls of the lower portion 82 of the outermost fins 8 have a smaller slope than the slope of the inner sidewall of the lower portion 82 of the outermost fins 8. The etch process may be a time-controlled process, and continue until the lower portions 82 reach a predetermined height $h_2$ from about 90 nm to about 250 nm. The lower portions 82 of the outer fins 8 may be formed to have a width $w_2$ from about 11 nm to 80 nm while the inner fins may have a width $w_3$ from about 10 nm to 50 nm. In illustrative embodiments, the width $w_2$ may be greater than the widths $w_1$ and the width $w_3$, and the width $w_3$ may be greater than the width $w_1$. For example, in an embodiment, width $w_1$ may be 15 nm, width $w_2$ may be 60 nm, and width $w_3$ may be 40 nm. In some embodiments, the trenches between the lower portions 82 may be etched to a height $h_3$ from about 40 nm to 200 nm that is less than the height $h_2$. In these embodiments, the widths $w_2$ and $w_3$ of the lower portions 82 may be measured from the bottom trench between the lower portions 82 rather than the top surface of the semiconductor substrate 4. As one of ordinary skill in the art will appreciate that other etch processes and etchant gases may be used to form the flared profile of the fins 8.

In forming the lower portions 82 of the fins 8 in the above described embodiments, the processing is controlled to form particular profiles of the lower portions 82. In the embodiment of FIGS. 5a and 5b, a flared profile is formed. The flared profile may help to minimize the deformation and defects of the fins 8 caused by the depositing of a dielectric material between and around the fins 8 of the FinFET device 1. In the embodiment in FIGS. 5a and 5b, the flared profile of the lower portion 82 has a substantially constant slope on both the inner sidewall and the outer sidewall. In alternative embodiments (discussed below), the outer lower sidewall may not have a constant slope.

The fins 8 serve as the fin structure for the to-be-formed FinFET device 1. The FinFET device 1 may comprise a single fin 8 to as many fins 8 as necessary for the FinFET device 1. FIGS. 1a through 9b illustrate the formation of a FinFET device 1 with three fins 8 as a non-limiting illustrative embodiment.

Figure 6B:
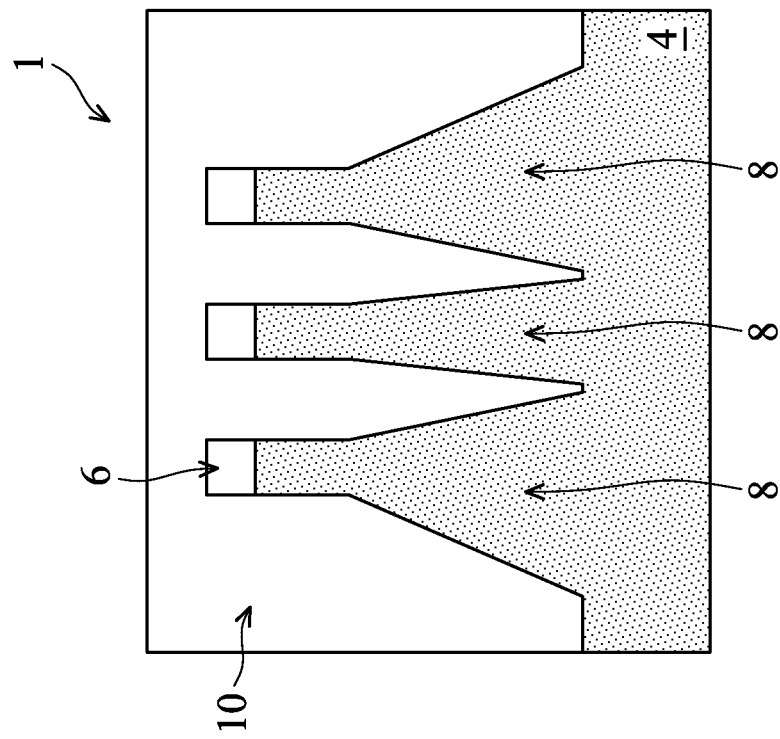
Figure 6A:
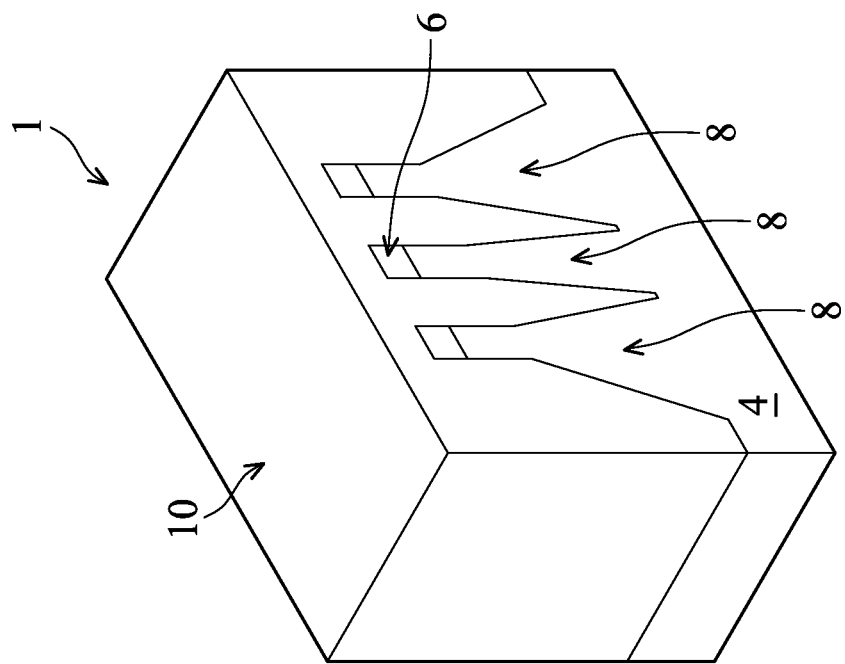

Referring now to FIGS. 6a and 6b, a dielectric layer 10 is blanket deposited on the FinFET device 1. The dielectric layer 10 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The dielectric layer 10 may be deposited through a process such as chemical vapor deposition (CVD), a spin-on-glass process, although any acceptable process may be utilized.

Figure 7B:
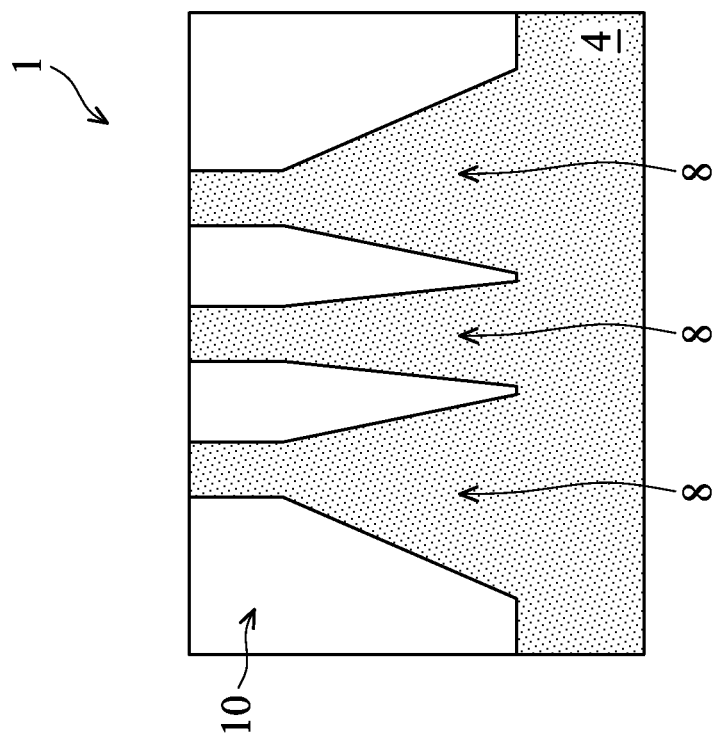
Figure 7A:
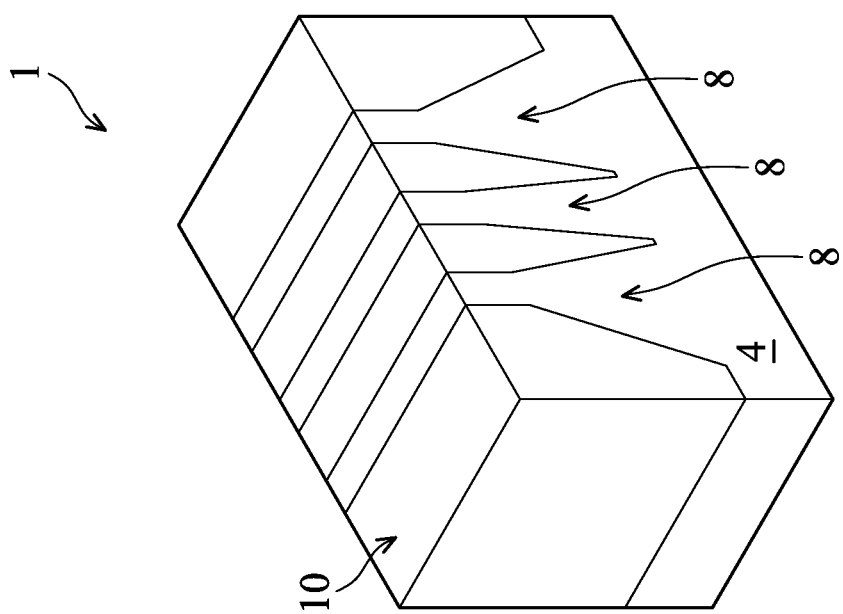

FIGS. 7a and 7b illustrate the next step in the manufacturing process, wherein the dielectric layer 10 is thinned to the level of the tops of the fins 8. The dielectric layer 10 may be thinned back in a variety of ways. In one embodiment, a chemical mechanical polishing (CMP), in which the dielectric layer 10 is reacted and then ground away using an abrasive. This process may remove the dielectric layer 10 until the tops of the hard mask layer 6. The hard mask layer 6 may be removed with phosphoric acid ($H_3PO_4$) until the tops of the fins 8 are exposed. Alternatively, in another embodiment, the dielectric layer 10 may be thinned back to the tops of the fins 8 by an etch process.

Figure 8B:
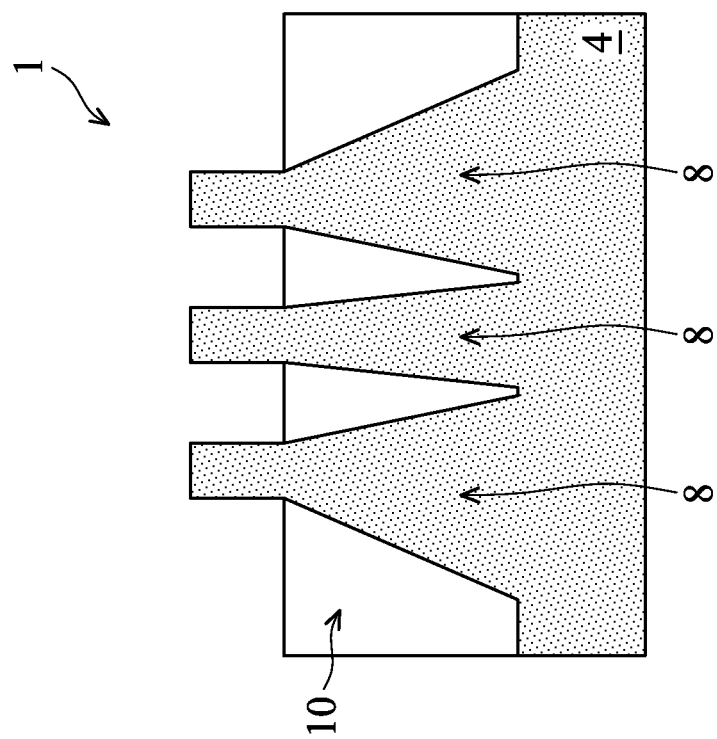
Figure 8A:
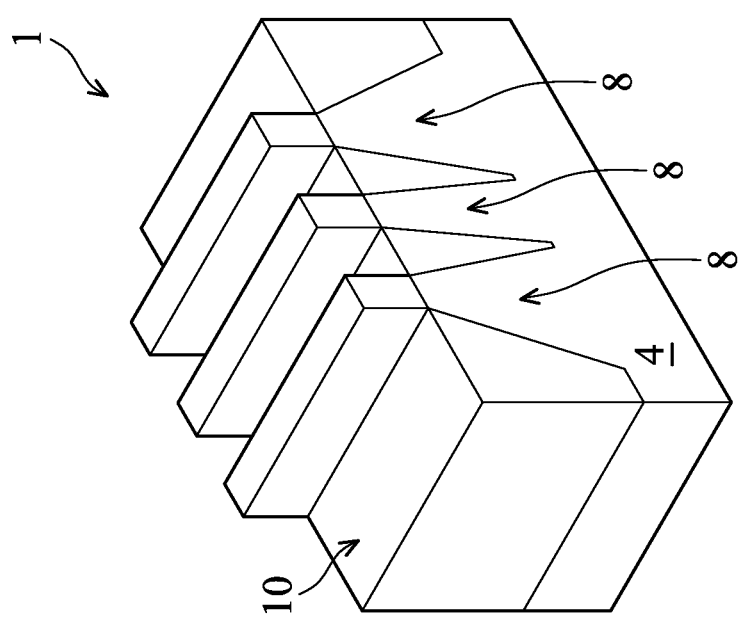

FIGS. 8a and 8b illustrate the next step of thinning the dielectric layer 10 below the tops of the fins 8. In one embodiment, the dielectric layer 10 may be thinned by a diluted hydrofluoric acid (DHF) treatment or a vapor hydrofluoric acid (VHF) treatment for a suitable time. In another embodiment, the preceding CMP process step may be skipped and the dielectric layer 10 may be selectively thinned back without removing the fins 8 by the DHF treatment or the VHF treatment described above.

Figure 9B:
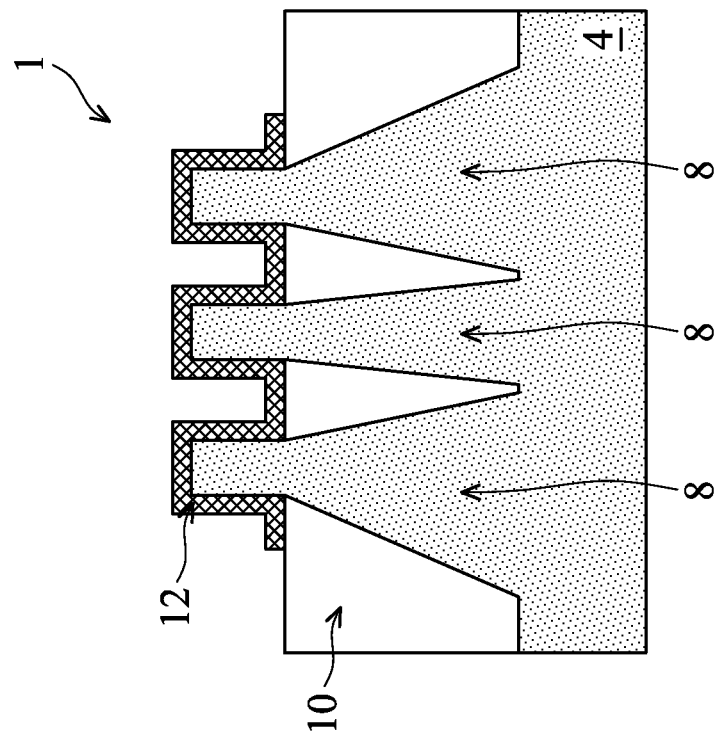
Figure 9A:
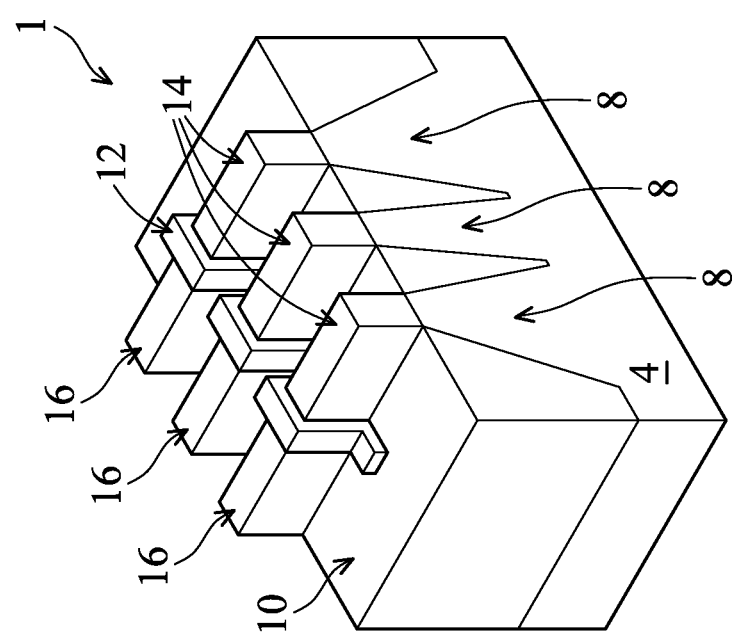

FIGS. 9a and 9b illustrate the formation of the gate structure 12 over the fins 8. The gate structure 12 may include a gate dielectric layer (not shown), a gate electrode (not shown), and gate spacers (not shown). The gate dielectric layer may be formed by thermal oxidation, CVD, sputtering, or any other methods known and used in the art for forming a gate dielectric. In other embodiments, the gate dielectric layer includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, and the like, and combinations and multi-layers thereof.

The gate electrode layer (not shown) may be formed over the gate dielectric layer. The gate electrode layer may comprise a conductive material and may be selected from a group comprising polycrystalline-silicon (poly-Si), poly-crystalline silicon-germanium (poly-SiGe), metallic nitrides, metallic silicides, metallic oxides, and metals. The gate electrode layer may be deposited by CVD, sputter deposition, or other techniques known and used in the art for depositing conductive materials. The top surface of the gate electrode layer usually has a non-planar top surface, and may be planarized prior to patterning of the gate electrode layer or gate etch. Ions may or may not be introduced into the gate electrode layer at this point. Ions may be introduced, for example, by ion implantation techniques. The gate electrode layer and the gate dielectric layer may be patterned to form the gate structure 12. The gate patterning process may be accomplished by depositing mask material (not shown) such as photoresist or silicon oxide over the gate electrode layer. The mask material is then patterned and the gate electrode layer is etched in accordance with the pattern.

After the formation of gate structure 12, source regions 14 and the drain regions 16 may be formed on the fins 8. The source regions 14 and the drain regions 16 may be doped by performing implanting process to implant appropriate dopants to complement the dopants in the fins 8. In another embodiment, the source regions 14 and the drain regions 16 may be formed by forming recesses (not shown) in fins 8 and epitaxially growing material in the recesses. The source regions 14 and the drain regions 16 may be doped either through an implantation method as discussed above, or else by in-situ doping as the material is grown. In an embodiment, a continuous metal layer may overly the three source regions 14 of the fins 8 to form a source region of the FinFET device 1. Further, a continuous metal layer may overly the three drain regions 16 to form a drain region of the FinFET device 1.

Gate spacers may be formed on opposite sides of the gate structure 12. The gate spacers (not shown) are typically formed by blanket depositing a spacer layer (not shown) on the previously formed structure. The spacer layer may comprise SiN, oxynitride, SiC, SiON, oxide, and the like and may be formed by methods utilized to form such a layer, such as chemical vapor deposition (CVD), plasma enhanced CVD, sputter, and other methods known in the art. The gate spacers are then patterned, preferably by anisotropically etching to remove the spacer layer from the horizontal surfaces of the structure.

FIGS. 10 through 16 illustrate further embodiments of FinFET device 1. In these embodiments, the widths $w_1$, $w_2$, and $w_3$ and the heights $h_1$, $h_2$, and $h_3$ (see FIGS. 4b and 5b) their respective relationships are applicable. These widths and heights are not shown in FIGS. 10, 11, and 14 through 16 for clarity.

Figure 10:
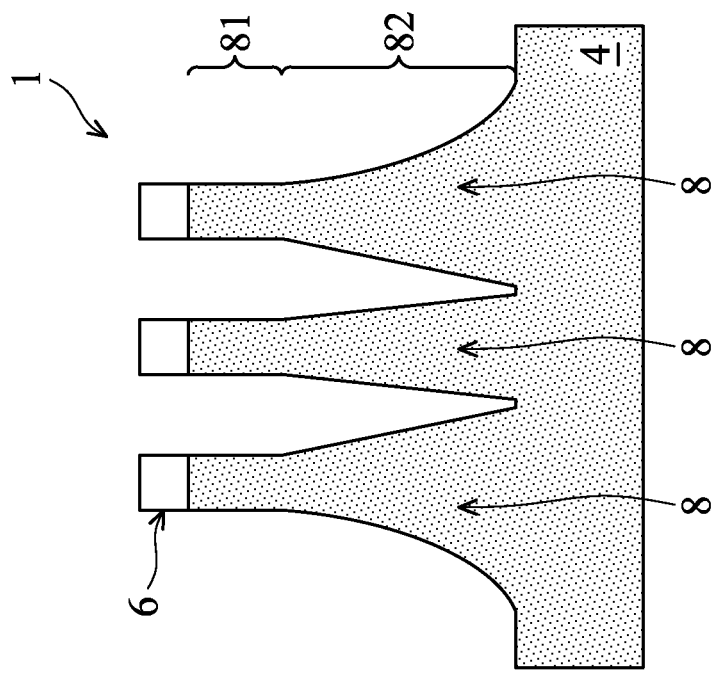
FIG. 10 illustrates in cross-sectional view a second illustrative embodiment of a FinFET device structure.

FIG. 10 illustrates a second embodiment in which the outer sidewall of the lower portions 82 of the outermost fins 8 are formed to have a non-constant slope. In this embodiment, the slope of the outer sidewall is greater at the top of the lower portion 82 and gradually decreases towards the bottom of the lower portion 82. Similar to the embodiment in FIGS. 5a and 5b, the width at the bottom of the lower portion 82 of the outermost fin 8 (See width $w_2$ in FIG. 5b) may be greater than the width of the upper portion 81 (See width $w_1$ in FIG. 5b) and the width at the bottom of the lower portion 82 of the inner fin 8 (See width $w_3$ in FIG. 5b). In addition, the width at the bottom of the lower portion 82 of the inner fin 8 (See width $w_3$ in FIG. 5b) may be greater than the width of the upper portion 81 (See width $w_1$ in FIG. 5b).

The embodiment in FIG. 10 may begin formation as shown in FIGS. 1a through 4b. After the formation of the upper portions 81 of the fins 8, the curved profile of the lower portions 82 may be formed by an etch process. In an embodiment, the etch process is a plasma dry etch process conducted in the same plasma etch chamber as the etch process for the upper portions 81. To form the curved profile of the lower portions 82, the etch process may include varying the process parameters of the etch process during the etch process. The time variable process parameters may include the gas flow ratio of etchant gas to passivation gas, the plasma source power, the substrate bias voltage, the bottom plate temperature, or the like. The etchant gas may contain HBr, $Cl_2$, combinations of these, or the like. The passivation gas may contain $N_2$, $O_2$, combinations of these, or the like. In an illustrative embodiment, the gas flow ratio of etchant gas to passivation gas may start from about 10:1 to 100:1 and be decreased during the etch process to about 3:1 to 5:1. The plasma source power may start from about 800 Watts to 1000 Watts and be decreased to about 200 Watts to 400 Watts. The substrate bias voltage may start from about 150 volts to 300 volts and be decreased to about 50 volts to 100 volts. The bottom plate temperature may start from about 50° C. to 60° C. and be decreased to about 10° C. to 20° C. For example, in a specific embodiment, the etch process may begin with a gas flow ratio of HBr to $O_2$ of 45:1 and end with a gas flow ratio of HBr to $O_2$ of 3:1. The etch process may begin with a plasma source power of 800 Watts and end with a plasma source power of 300 Watts. The etch process may begin with a substrate bias voltage of 300 volts and end with a substrate bias voltage of 100 volts. The etch process may begin with a bottom plate temperature of 60° C. and end with a bottom plate temperature of 20° C.

Figure 11:
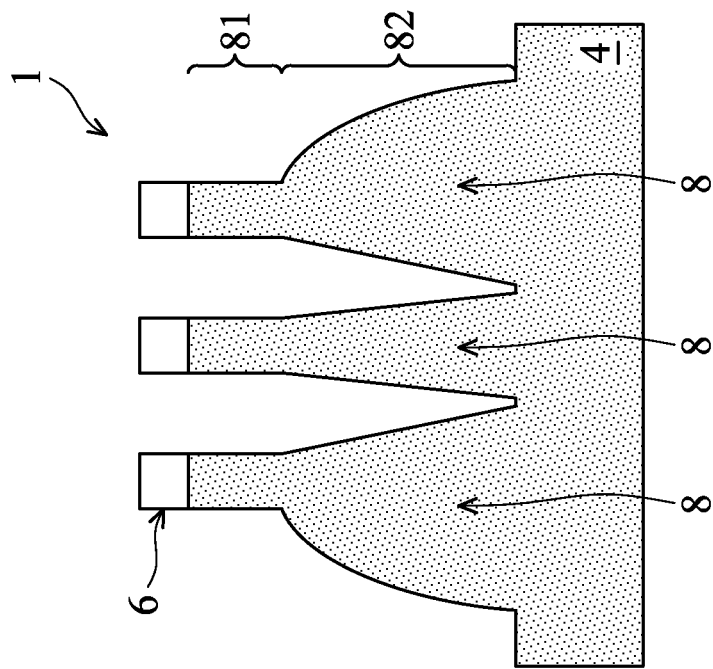
FIG. 11 illustrates in cross-sectional view a third illustrative embodiment of a FinFET device structure.

FIG. 11 illustrates a third embodiment in which the outer sidewall of the lower portions 82 of the outermost fins 8 are formed to have a non-constant slope. In this embodiment, the slope of the outer sidewall is smaller at the top of the lower portion 82 and gradually increases towards the bottom of the lower portion 82. Similar to the embodiment in FIGS. 5a and 5b, the width at the bottom of the lower portion 82 of the outermost fin 8 (See width $w_2$ in FIG. 5b) may be greater than the width of the upper portion 81 (See width $w_1$ in FIG. 5b) and the width at the bottom of the lower portion 82 of the inner fin 8 (See width $w_3$ in FIG. 5b). In addition, the width at the bottom of the lower portion 82 of the inner fin 8 (See width $w_3$ in FIG. 5b) may be greater than the width of the upper portion 81 (See width $w_1$ in FIG. 5b).

The embodiment in FIG. 11 may begin formation as shown in FIGS. 1a through 4b. After the formation of the upper portions 81 of the fins 8, the curved profile of the lower portions 82 may be formed by an etch process. In an embodiment, the etch process is a plasma dry etch process conducted in the same plasma etch chamber as the etch process for the upper portions 81. To form the curved profile of the lower portions 82, the etch process may include varying the process parameters of the etch process during the etch process. The time variable process parameters may include the gas flow ratio of etchant gas to passivation gas, the plasma source power, the substrate bias voltage, the bottom plate temperature, or the like. The etchant gas may contain HBr, $Cl_2$, combinations of these, or the like. The passivation gas may contain $N_2$, $O_2$, combinations of these, or the like. In an illustrative embodiment, the gas flow ratio of etchant gas to passivation gas may start from about 3:1 to 5:1 and be increased during the etch process to about 10:1 to 100:1. The plasma source power may start from about 200 Watts to 400 Watts and be increased to about 800 Watts to 1000 Watts. The substrate bias voltage may start from about 50 volts to 150 volts and be increased to about 150 volts to 300 volts. The bottom plate temperature may start from about 10° C. to 20° C. and be increased to about 50° C. to 60° C. For example, in a specific embodiment, the etch process may begin with a gas flow ratio of HBr to $O_2$ of 3:1 and end with a gas flow ratio of HBr to $O_2$ of 45:1. The etch process may begin with a plasma source power of 300 Watts and end with a plasma source power of 800 Watts. The etch process may begin with a substrate bias voltage of 100 volts and end with a substrate bias voltage of 300 volts. The etch process may begin with a bottom plate temperature of 20° C. and end with a bottom plate temperature of 60° C.

As one of ordinary skill in the art will appreciate, other etch process parameters may be included in the time variable process parameters to form the curved profiles of FIGS. 10 and 11. For example, the time variable process parameters may further include the process pressure or the process temperature.

Figure 12:
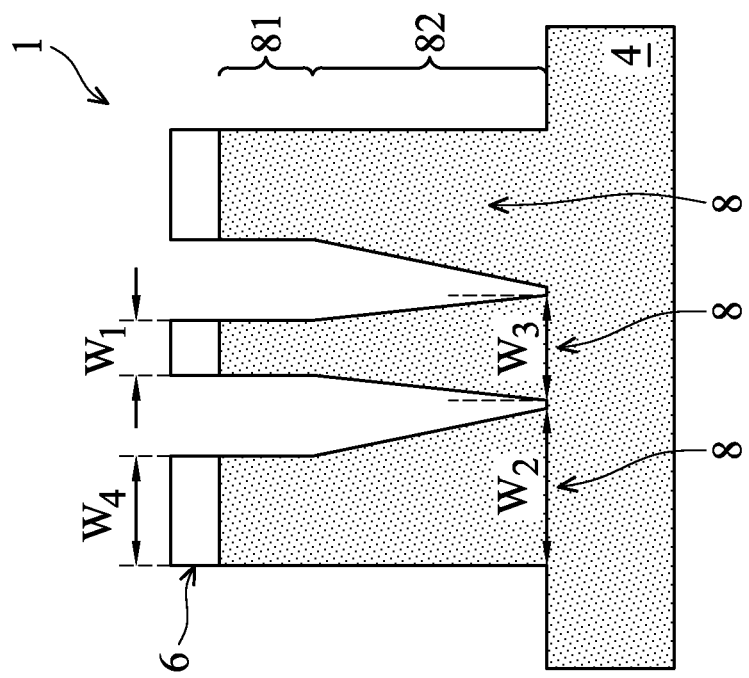
FIG. 12 illustrates in cross-sectional view a fourth illustrative embodiment of a FinFET device structure.

FIG. 12 illustrates a fourth embodiment in which the upper portion 81 of the outermost fins 8 are wider than the upper portion 81 of the inner fins 8 and outer sidewall of the outermost fins 8 are formed to have a profile that is substantially orthogonal to the top surface of the semiconductor substrate 4. In this embodiment, the upper portion 81 of the outermost fin 8 may have a width $w_4$ (see FIG. 12) that is greater than the width $w_1$. The width $w_4$ may be from about 6 nm to 40 nm. Similar to the embodiment in FIGS. 5a and 5b, the width at the bottom of the lower portion 82 of the outermost fin 8 (See width $w_2$ in FIG. 12) may be greater than the width of the upper portion 81 of the inner fin 8 (See width $w_1$ in FIG. 12), the width at the bottom of the lower portion 82 of the inner fin 8 (See width $w_3$ in FIG. 12), and the width $w_4$. In addition, the width at the bottom of the lower portion 82 of the inner fin 8 (See width $w_3$ in FIG. 12) may be greater than the width of the upper portion 81 of the inner fin 8 (See width $w_1$ in FIG. 12).

The embodiment in FIG. 12 may begin formation as shown in FIGS. 1a through 4b. However, the patterning of the photosensitive material layer 2 (See FIGS. 2a and 2b) may be vary from those figures because the width of the pattern for the outermost fins may be larger than the width of the pattern for the inner fins. Accordingly, when the pattern is transferred to the hard mask layer 6 (See FIGS. 3a and 3b), the outer portions of the hard mask layer 6 may be wider than the inner portions. After the formation of the upper portions 81 of the fins 8 (See FIGS. 4a and 4b), the lower portions 82 may be formed by an etch process. In an embodiment, the etch process is an anisotropic plasma dry etch process conducted in the same plasma etch chamber as the etch process for the upper portions 81. The etchant gas may contain $CF_4$, $SF_6$, $NF_3$, $CH_3F$, $CH_2F_2$, $CHF_3$, the like, or combinations of these. In this specific embodiment, the outer sidewall of the outermost fins 8 is substantially linear and substantially orthogonal to the top surface of the semiconductor substrate 4.

Figure 13:
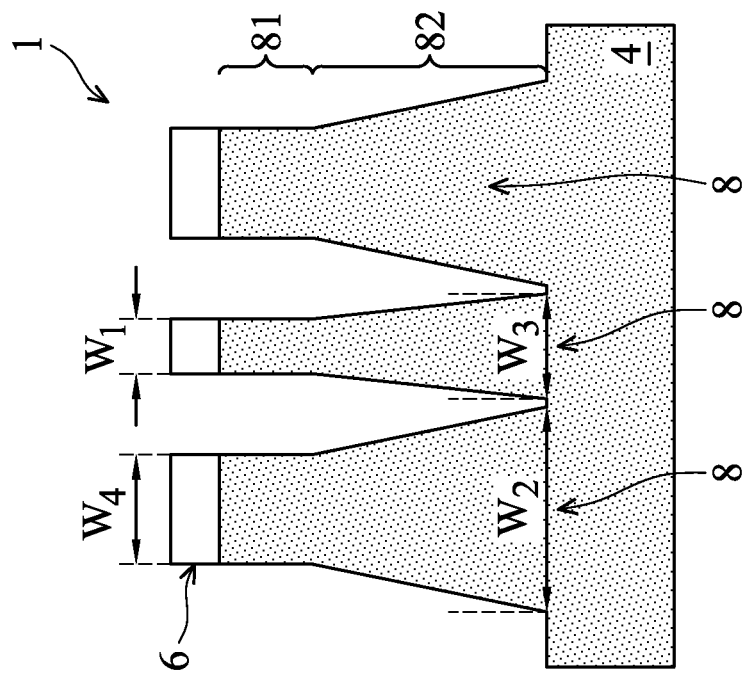
FIG. 13 illustrates in cross-sectional view a fifth illustrative embodiment of a FinFET device structure.

FIG. 13 illustrates a fifth embodiment in which the upper portion 81 of the outermost fins 8 are wider than the upper portion 81 of the inner fins 8 and outer sidewall of the lower portion 82 of the outermost fins 8 are formed to have a flared profile that is substantially non-orthogonal to the top surface of the semiconductor substrate 4. Similar to the embodiment in FIG. 12, the upper portion 81 of the outermost fin 8 may have a width $w_4$ (see FIGS. 12 and 13) that is greater than the width $w_1$. Similar to the embodiment in FIGS. 5a and 5b, the width at the bottom of the lower portion 82 of the outermost fin 8 (See width $w_2$ in FIG. 13) may be greater than the width of the upper portion 81 of the inner fin 8 (See width $w_1$ in FIG. 13), the width at the bottom of the lower portion 82 of the inner fin 8 (See width $w_3$ in FIG. 13), and the width $w_4$. In addition, the width at the bottom of the lower portion 82 of the inner fin 8 (See width $w_3$ in FIG. 13) may be greater than the width of the upper portion 81 of the inner fin 8 (See width $w_1$ in FIG. 13).

The embodiment in FIG. 13 may begin formation similar to the embodiment in FIG. 12 with the outermost fins 8 having a wider upper portion 81 than the inner fins 8. After the formation of the upper portions 81 of the fins 8 (See FIGS. 4a and 4b), the lower portions 82 may be formed by an etch process. In an embodiment, the etch process is an anisotropic plasma dry etch process conducted in the same plasma etch chamber as the etch process for the upper portions 81. The etchant gas may contain HBr, $Cl_2$, $O_2$, $N_2$, the like, or combinations of these. In this specific embodiment, the outer sidewall of the lower portion 82 of the outermost fins 8 is non-orthogonal to a top surface of the semiconductor substrate 4 with a substantially constant slope.

Figure 14:
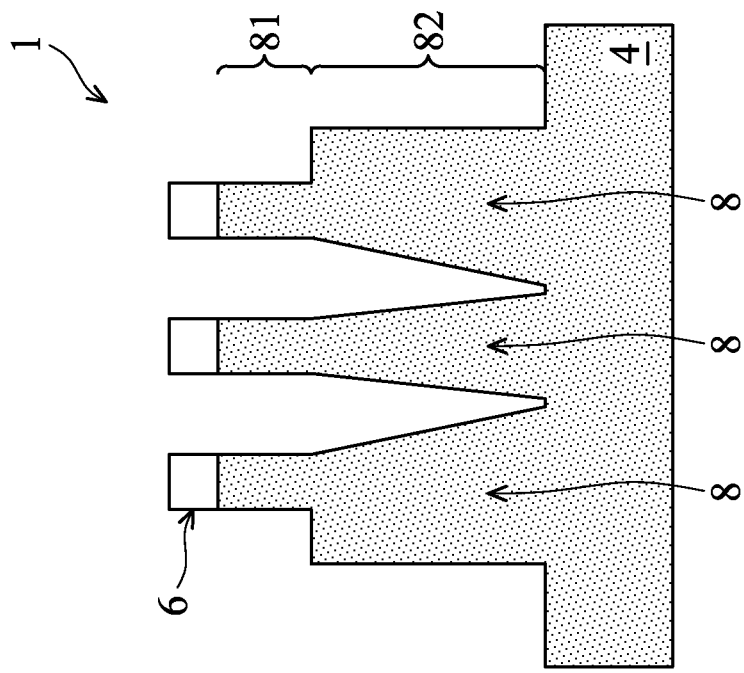
FIG. 14 illustrates in cross-sectional view a sixth illustrative embodiment of a FinFET device structure.

FIG. 14 illustrates a sixth embodiment in which the lower portion 82 of the outermost fin 8 has a top surface that is substantially parallel to a top surface of the semiconductor substrate 4 and the outer sidewall of the lower portion 82 of the outermost fin is linear and substantially orthogonal to the top surface of the semiconductor substrate 4. Similar to the embodiment in FIGS. 5a and 5b, the width at the bottom of the lower portion 82 of the outermost fin 8 (See width $w_2$ in FIG. 5b) may be greater than the width of the upper portion 81 (See width $w_1$ in FIG. 5b) and the width at the bottom of the lower portion 82 of the inner fin 8 (See width $w_3$ in FIG. 5b). In addition, the width at the bottom of the lower portion 82 of the inner fin 8 (See width $w_3$ in FIG. 5b) may be greater than the width of the upper portion 81 (See width $w_1$ in FIG. 5b).

The embodiment in FIG. 14 may begin formation as shown in FIGS. 1a through 4b. After the formation of the upper portions 81 of the fins 8 (See FIGS. 4a and 4b), the lower portions 82 may be formed by patterning process followed by an etch process. In an embodiment, the patterning process may be similar to the patterning process as illustrated in FIGS. 1a through 4b for the formation of the upper portions 81 of the fins 8. For example, the patterning process may include depositing a hard mask layer, depositing a photo-sensitive material layer, patterning the photo-sensitive material layer, and transferring the pattern to the hard mask layer. In this embodiment, the etch process may be an anisotropic plasma dry etch process conducted in the same plasma etch chamber as the etch process for the upper portions 81. The etchant gas may contain $CF_4$, $SF_6$, $NF_3$, $CH_3F$, $CH_2F_2$, $CHF_3$, the like, or combinations of these. In this specific embodiment, the outer sidewall of the outermost fins 8 includes an upper portion 81 and a lower portion 82 that is substantially orthogonal to a top surface of the semiconductor substrate 4 with the lower portion 82 of the outer sidewall being laterally spaced from the upper portion 81 in a direction away from the inner fins 8. The connection of the outer sidewall of the upper portion 81 and the lower portion 82 forming a top surface of the lower portion 82 that is substantially parallel to the top surface of the semiconductor substrate 4.

Figure 15:
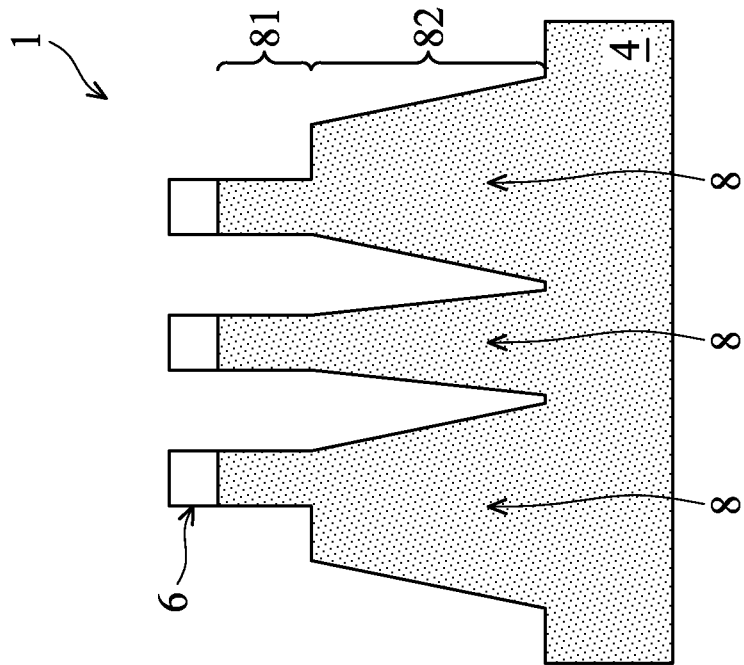
FIG. 15 illustrates in cross-sectional view a seventh illustrative embodiment of a FinFET device structure.

FIG. 15 illustrates a seventh embodiment in which the lower portion 82 of the outermost fin 8 has a top surface that is substantially parallel to a top surface of the semiconductor substrate 4 and the outer sidewall of the lower portion 82 of the outermost fin having a flared profile with a constant slope that is non-orthogonal to the top surface of the semiconductor substrate 4. Similar to the embodiment in FIGS. 5a and 5b, the width at the bottom of the lower portion 82 of the outermost fin 8 (See width $w_2$ in FIG. 5b) may be greater than the width of the upper portion 81 (See width $w_1$ in FIG. 5b) and the width at the bottom of the lower portion 82 of the inner fin 8 (See width $w_3$ in FIG. 5b). In addition, the width at the bottom of the lower portion 82 of the inner fin 8 (See width $w_3$ in FIG. 5b) may be greater than the width of the upper portion 81 (See width $w_1$ in FIG. 5b).

The embodiment in FIG. 15 may begin formation similar to the embodiment in FIG. 14. After the patterning process to form the top surface of the lower portion 82 of the outer sidewall of the outermost fins, the etch process may be performed. The etch process may be an anisotropic plasma dry etch process conducted in the same plasma etch chamber as the etch process for the upper portions 81. The etchant gas may contain $HBr$, $Cl_2$, $O_2$, $N_2$, the like, or combinations of these. In this specific embodiment, the outer sidewall of the outermost fins 8 includes an upper portion 81 that is substantially orthogonal to a top surface of the semiconductor substrate 4 and a lower portion 82 that is non-orthogonal to the top surface of the semiconductor substrate 4 with the lower portion 82 of the outer sidewall having a flared profile. The connection of the outer sidewall of the upper portion 81 and the lower portion 82 forming a top surface of the lower portion 82 that is substantially parallel to the top surface of the semiconductor substrate 4.

Figure 16:
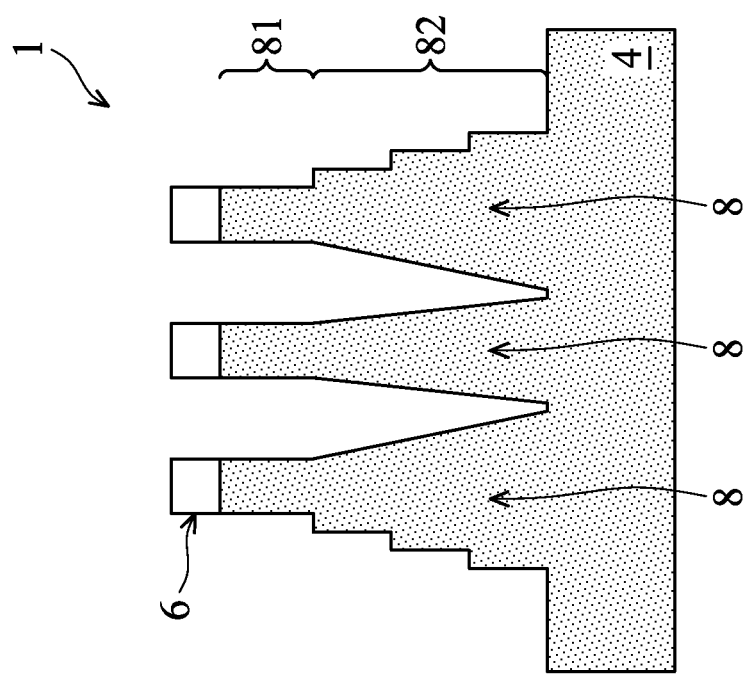
FIG. 16 illustrates in cross-sectional view an eighth illustrative embodiment of a FinFET device structure.

FIG. 16 illustrates an eighth embodiment in which the outer sidewall of the lower portion 82 of the outermost fin 8 has a stair-step profile. Similar to the embodiment in FIGS. 5a and 5b, the width at the bottom of the lower portion 82 of the outermost fin 8 (See width $w_2$ in FIG. 5b) may be greater than the width of the upper portion 81 (See width $w_1$ in FIG. 5b) and the width at the bottom of the lower portion 82 of the inner fin 8 (See width $w_3$ in FIG. 5b). In addition, the width at the bottom of the lower portion 82 of the inner fin 8 (See width $w_3$ in FIG. 5b) may be greater than the width of the upper portion 81 (See width $w_1$ in FIG. 5b).

The embodiment in FIG. 16 may begin formation similar to the embodiments in FIGS. 14 and 15. Similar to those embodiments, the formation of embodiment in FIG. 16 includes a patterning process followed by an etch process. However, in this embodiment this process is repeated two more times to create three sections of the outer sidewall of the lower portion 82 of the outermost fin 8 that are substantially parallel to the top surface of the semiconductor substrate 4, and three sections of the outer sidewall of the lower portion 82 of the outermost fin 8 that are substantially orthogonal to the top surface of the semiconductor substrate 4. The repeated etch process may be an anisotropic plasma dry etch process conducted in the same plasma etch chamber as the etch process for the upper portions 81. The etchant gas may contain $HBr$, $Cl_2$, $O_2$, $N_2$, $CF_4$, $SF_6$, $NF_3$, $CH_3F$, $CH_2F_2$, $CHF_3$, the like, or combinations of these. In this specific embodiment, the outer sidewall of the outermost fins 8 includes an upper portion 81 that is substantially orthogonal to a top surface of the semiconductor substrate 4 and a lower portion 82 that includes three sections that are orthogonal and three sections that are parallel to the top surface of the semiconductor substrate 4 with the orthogonal and parallel sections being adjoined in an alternating pattern. As one of ordinary skill in the art will appreciate, the number of orthogonal and parallel sections in the lower portion 82 may be increased or decreased as necessary. For example, the lower portion 82 may include 2, 4, 5, or 6 sections that are parallel and the same number that are orthogonal to the top surface of the semiconductor substrate 4.

The embodiments in FIGS. 10 through 16 may continue processing to form a gate structure and source and drain regions. The gate structure may include a gate dielectric, a gate electrode, and gate spacers (See FIGS. 9a and 9b). The formation of the gate structure and the source and drain regions has been described above with respect to FIGS. 9a and 9b, and hence is not repeated herein.

Although not shown in FIGS. 10 through 16 for clarity, the embodiments in those figures may include a time-controlled etch process for the lower portions 82 that continues until the lower portions 82 reach a predetermined height $h_2$ (See FIG. 5b). In addition, the trenches between the lower portions 82 may be etched to a height $h_3$ that is less than the height $h_2$. In these embodiments, the widths $w_2$ and $w_3$ of the lower portions 82 may be measured from the bottom trench between the lower portions 82 rather than the top surface of the semiconductor substrate 4.

An embodiment a FinFET device comprising a first semiconductor fin over a semiconductor substrate. The first semiconductor fin comprises a first upper portion having a first width; and a first lower portion under the first upper portion, the first lower portion having a second width, the second width being larger than the first width. The FinFET device further comprising a second semiconductor fin over the semiconductor substrate, wherein the second semiconductor fin is laterally adjacent the first semiconductor fin. The second semiconductor fin comprises a second upper portion having a third width; and a second lower portion under the second upper portion, the second lower portion having a fourth width, the fourth width being larger than the third width, and the fourth width being less than the second width.

Another embodiment is a FinFET device comprising a first semiconductor fin over a semiconductor substrate, the first semiconductor fin comprising a first upper section having a first inner side and a first outer side, the first inner side and the first outer side separated by a first width, and the first inner side and the first outer side being orthogonal to a top surface of the semiconductor substrate; and a first lower section having a second inner side and a second outer side, the second inner side having a first slope, the second outer side having a second slope, the first slope being greater than the second slope, the second inner side and the second outer side are separated by a second width at a top area of the first lower section, and the second inner side and the second outer side are separated by a third width at a bottom area of the first lower section, the third width greater than the second width, and the third width greater than the first width. The FinFET device further comprising a second semiconductor fin over the substrate, the second semiconductor fin comprising a second upper section having a third inner side and a third outer side, the third outer side being the side nearest the first inner side, the third inner side and the third outer side separated by a fourth width, and the third inner side and the third outer side being orthogonal to the top surface of the semiconductor substrate; and a second lower section having a fourth inner side and a fourth outer side, the fourth inner side having a third slope, the fourth outer side having a third slope, the fourth inner side and the fourth outer side are separated by a fifth width at a top area of the second lower section, and the fourth inner side and the fourth outer side are separated by a sixth width at a bottom area of the second lower section, the sixth width being greater than the fifth width, the sixth width being greater than the fourth width, and the sixth width being less than the third width. The FinFET device further comprising a gate dielectric over the first outer side, a first top surface, and the first inner side of the first semiconductor fin, and the gate dielectric over the third outer side, a second top surface, and the third inner side of the second semiconductor fin, and a gate electrode over the gate dielectric.

A further embodiment is a method for forming a FinFET device. The method comprising forming a plurality of semiconductor fins over a semiconductor substrate, the forming a plurality comprising patterning a first upper portion of a first semiconductor fin; at a same time as the patterning the first upper portion, patterning a second upper portion of a second semiconductor fin; forming a first lower portion of the first semiconductor fin, the first lower portion under the first upper portion, and the first lower portion having a first top section and a first bottom section, the first top section having a first width and the first bottom section having a second width, the second width being larger than the first width. The method further comprising at a same time as the forming the first lower portion, forming a second lower portion of the second semiconductor fin, the second lower portion under the second upper portion, and the second lower portion having a second top section and a second bottom section, the second top section having a third width and the second bottom section having a fourth width, the fourth width being larger than the third width, and the fourth width being less the second width.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A FinFET device comprising:
   a first semiconductor fin over a semiconductor substrate, wherein the first semiconductor fin comprises:
   a first upper portion having a first width; and
   a first lower portion under the first upper portion, the first lower portion having a second width, the second width being larger than the first width; and
   a second semiconductor fin over the semiconductor substrate, wherein the second semiconductor fin is laterally adjacent the first semiconductor fin, the second semiconductor fin comprises:
   a second upper portion having a third width; and
   a second lower portion under the second upper portion, the second lower portion having a fourth width, the fourth width being larger than the third width, and the fourth width being less than the second width.

2. The FinFET device of claim 1, wherein the first upper portion further comprises a first inner sidewall and a first outer sidewall, the first inner sidewall and the first outer sidewall being orthogonal to a top surface of the semiconductor substrate, and the first lower portion further comprises a second inner sidewall having a first slope and a second outer sidewall having a second slope, the second slope being less than the first slope, and the second inner sidewall and the second outer sidewall being non-orthogonal to the top surface of the semiconductor substrate.

3. The FinFET device of claim 2, wherein the first slope is a constant slope and the second slope is a constant slope.

4. The FinFET device of claim 2, wherein the first slope is a constant slope and the second slope is a non-constant slope.

5. The FinFET device of claim 2, wherein the first width is larger than the third width.

6. The FinFET device of claim 1, wherein the first width is larger than the third width, and the first upper portion further comprises a first inner sidewall and a first outer sidewall, the first inner sidewall and the first outer sidewall being orthogonal to a top surface of the semiconductor substrate, and the first lower portion further comprises a second inner sidewall and a second outer sidewall, the second inner sidewall being non-orthogonal to the top surface of the semiconductor substrate, the second outer sidewall being orthogonal to the top surface of the semiconductor substrate, and the second outer sidewall being aligned with the first outer sidewall.

7. The FinFET device of claim 1, wherein the first upper portion further comprises a first inner sidewall and a first outer sidewall, the first inner sidewall and the first outer sidewall being orthogonal to a top surface of the semiconductor substrate, and the first lower portion further comprises a second inner sidewall and a second outer sidewall, the second inner sidewall being non-orthogonal to the top surface of the semiconductor substrate, the second outer sidewall being orthogonal to the top surface of the semiconductor substrate, and the second outer sidewall being laterally spaced from the first outer sidewall in a direction opposite of the second inner sidewall.

8. The FinFET device of claim 1, wherein the first upper portion further comprises a first inner sidewall and a first outer sidewall, the first inner sidewall and the first outer sidewall being orthogonal to a top surface of the semiconductor substrate, and the first lower portion further comprises a second inner sidewall and a second outer sidewall, the second inner sidewall being non-orthogonal to the top surface of the semiconductor substrate, the second outer sidewall being non-orthogonal to the top surface of the semiconductor substrate and the second outer sidewall being laterally spaced from the first outer sidewall in a direction opposite of the second inner sidewall.

9. The FinFET device of claim 1, wherein the first upper portion further comprises a first inner sidewall and a first outer sidewall, the first inner sidewall and the first outer sidewall being orthogonal to a top surface of the semiconductor substrate, and the first lower portion further comprises a second inner sidewall and a second outer sidewall, the second inner sidewall being non-orthogonal to the top surface of the semiconductor substrate, the second outer sidewall comprising a first set of sections being orthogonal to the top surface of the semiconductor substrate and a second set of sections being parallel to the top surface of the semiconductor substrate, the first set and the second set being adjoined in an alternating pattern.

10. The FinFET device of claim 1 further comprising:
    a gate dielectric on a top surface and sidewalls of the first semiconductor fin, and the gate dielectric on a top surface and sidewalls of the second semiconductor fin; and
    a gate electrode on the gate dielectric.

11. A FinFET device comprising:
    a first semiconductor fin over a semiconductor substrate, the first semiconductor fin comprising:
    a first upper section having a first inner side and a first outer side, the first inner side and the first outer side separated by a first width, and the first inner side and the first outer side being orthogonal to a top surface of the semiconductor substrate; and a first lower section having a second inner side and a second outer side, the second inner side having a first slope, the second outer side having a second slope, the first slope being greater than the second slope, the second inner side and the second outer side are separated by a second width at a top area of the first lower section, and the second inner side and the second outer side are separated by a third width at a bottom area of the first lower section, the third width greater than the second width, and the third width greater than the first width;

a second semiconductor fin over the semiconductor substrate, the second semiconductor fin comprising:

a second upper section having a third inner side and a third outer side, the third outer side being the side nearest the first inner side, the third inner side and the third outer side separated by a fourth width, and the third inner side and the third outer side being orthogonal to the top surface of the semiconductor substrate; and a second lower section having a fourth inner side and a fourth outer side, the fourth inner side and the fourth outer side having a third slope, the fourth inner side and the fourth outer side are separated by a fifth width at a top area of the second lower section, and the fourth inner side and the fourth outer side are separated by a sixth width at a bottom area of the second lower section, the sixth width being greater than the fifth width, the sixth width being greater than the fourth width, and the sixth width being less than the third width;

a gate dielectric over the first outer side, a first top surface, and the first inner side of the first semiconductor fin, and the gate dielectric over the third outer side, a second top surface, and the third inner side of the second semiconductor fin; and a gate electrode over the gate dielectric.

12. The FinFET device of claim 11 wherein the top area of the second outer side is aligned with the first outer side.

13. The FinFET device of claim 11 wherein the top area of the second outer side is laterally spaced from the first outer side in a direction opposite of the second inner side.

14. The FinFET device of claim 11, wherein the first width is greater than the fourth width.

* * * * *